(12) United States Patent
Zweers

(10) Patent No.: US 7,652,628 B2
(45) Date of Patent: Jan. 26, 2010

(54) ANTENNA FOR USE IN EARPHONE AND EARPHONE WITH INTEGRATED ANTENNA

(75) Inventor: Jan-Willem Zweers, Wezep (NL)

(73) Assignee: Sony Ericsson Mobile Communications AB, Lund (SE)

(*) Notice: Subject to any disclaimer, the term of this patent is extended or adjusted under 35 U.S.C. 154(b) by 0 days.

(21) Appl. No.: 12/048,011

(22) Filed: Mar. 13, 2008

(65) Prior Publication Data

US 2009/0231211 A1  Sep. 17, 2009

(51) Int. Cl.
*H01Q 1/24* (2006.01)
*H01Q 1/12* (2006.01)

(52) U.S. Cl. .................. 343/702; 343/718; 343/895
(58) Field of Classification Search .......... 343/702, 343/718, 700 MS, 841, 866, 895
See application file for complete search history.

(56) References Cited

U.S. PATENT DOCUMENTS

| 5,621,422 | A  | * | 4/1997 | Wang | 343/895 |
| 6,137,453 | A  | * | 10/2000 | Wang et al. | 343/895 |
| 7,064,720 | B2 | * | 6/2006 | Yoshino | 343/702 |
| 7,443,300 | B2 | * | 10/2008 | Tessier | 340/572.7 |
| 2007/0040761 | A1 | * | 2/2007 | Waterhouse | 343/895 |
| 2007/0229369 | A1 |   | 10/2007 | Platz | |

FOREIGN PATENT DOCUMENTS

| EP | 0 340 594 A1 | 11/1989 |
| EP | 0 443 717 A2 | 1/1991 |
| EP | 0 448 764 | 10/1991 |
| EP | 1 587 343 A2 | 10/2005 |
| JP | 2006121633 | 5/2006 |
| WO | WO 2005/081583 A1 | 9/2005 |

OTHER PUBLICATIONS

Invitation to Pay Additional Fees and Partial International Search for PCT/IB2008/053693 dated May 20, 2009.

* cited by examiner

*Primary Examiner*—Hoang V Nguyen
(74) *Attorney, Agent, or Firm*—Myers Bigel Sibley & Sajovec

(57) ABSTRACT

An electronic device includes a dielectric plate oriented parallel to a first direction. A conductive trace may be on a surface of the dielectric plate and forms a meander pattern on the surface of the dielectric plate. The conductive trace forms a loop antenna element including an RF feed point at a first end of the trace and a ground point at a second end of the conductive trace. A meandered printed circuit board (PCB) extends from the dielectric plate on a side of the dielectric plate opposite the conductive trace. The meandered PCB includes a plurality of primary portions extending in a second direction perpendicular to the first direction, and the plurality of primary portions include electronic components mounted thereon.

19 Claims, 2 Drawing Sheets

ANTENNA FOR USE IN EARPHONE AND EARPHONE WITH INTEGRATED ANTENNA

BACKGROUND

The present invention relates to electronic devices and, more particularly, to electronic devices including antennas for RF communication.

Antennas are well known devices that are used to convert electric current to electromagnetic waves and vice versa. The electromagnetic waves can be used to communicate information wirelessly from one electronic device to another.

An antenna includes an arrangement of electric conductors that radiates electromagnetic energy in response to an applied electric signal. Similarly, an antenna generates an electric signal at its terminals in response to an applied electromagnetic field.

Antennas are typically tuned to receive and transmit electromagnetic waves having a frequency that is near a resonant frequency (or center wavelength) of the antenna. The resonant frequency of an antenna is related to the electrical length of the antenna, which depends on the physical length of the antenna and on the dielectric material used in the antenna's construction. The dielectric material affects the velocity of signal propagation in the antenna. An antenna may be designed to transmit a narrow or broad range of frequencies. Furthermore, an antenna may be designed to transmit/receive electromagnetic waves in a directional fashion or an omnidirectional fashion.

Many aspects of an antenna affect its performance and/or suitability for a particular application. For example, antennas are characterized by such attributes as gain, radiation pattern (directionality), impedance, efficiency, bandwidth and polarization.

Typically, an antenna has an electrical length that is about ¼ of a wavelength at the antenna's resonant frequency. Wireless telephones operate at a frequency of about 800 MHz to about 2.4 GHz. Some short range wireless RF communication devices operate in similar frequency ranges. For example, devices operating according to the Bluetooth standard use microwave radio frequency spectrum in the 2.4 GHz to 2.4835 GHz range. Accordingly, an antenna tuned to transmit/receive Bluetooth signals typically has an electrical length ($\lambda$/4) of about 3.1 cm.

Wireless telephones have commonly used simple vertical rods ¼ wavelength in length as antennas. While simple in design and providing omnidirectional transmission/reception (except for a null in the direction the rod points), these antennas have been used less widely as communication devices have become more and more miniaturized.

A compact, directional antenna design commonly used in wireless communication devices is a microstrip patch antenna. A microstrip patch antenna is a narrow bandwidth antenna that includes a conductive strip on one side of a dielectric layer and a conductive ground plane on the other side of the dielectric layer. Electric signals are transmitted to/from the conductive strip from feed points on the dielectric layer. The conductive strip can be formed by depositing metal on the dielectric layer and selectively etching the metal to form a desired pattern. The microstrip patch antenna preferentially radiates electromagnetic energy in a direction away from the ground plane.

While microstrip patch antennas can be miniaturized to fit on a handheld communication device, it is difficult to miniaturize such antennas further.

SUMMARY

An electronic device according to some embodiments includes a dielectric plate oriented parallel to a first direction. A conductive trace may be on a surface of the dielectric plate and forms a meander pattern on the surface of the dielectric plate. The conductive trace forms a loop antenna element including an RF feed point at a first end of the trace and a ground point at a second end of the conductive trace. A meandered printed circuit board (PCB) extends from the dielectric plate on a side of the dielectric plate opposite the conductive trace. The meandered PCB includes a plurality of primary portions extending in a second direction perpendicular to the first direction, and the plurality of primary portions include electronic components mounted thereon.

The primary portions of the meandered PCB include rigid PCBs. The meandered PCB may include a plurality of flexible PCBs, with the plurality of flexible PCBs connecting adjacent ones of the plurality of rigid PCBs. The primary portions may be spaced apart from one another in the first direction.

The electronic device may further include first and second parallel rigid PCBs and a third rigid PCB between the first and second rigid PCBs. A distance D between the first and second rigid PCBs may be less than a width W of the conductive plate. A total length of the meandered printed circuit board may be about one quarter of a center wavelength of the antenna.

The dielectric plate may be connected to a first end of the meandered PCB, the device may further include a planar connection board connected to a second end of the meandered PCB, opposite the first end of the meandered PCB, the planar connection board having a major surface oriented parallel to the first direction.

The conductive trace may include a high impedance portion proximate the RF feed point and a low impedance portion proximate the ground point. The high impedance portion of the conductive trace may be located closer to a center of the dielectric plate than the low impedance portion. In particular embodiments, the dielectric plate may be generally circular, and the low impedance portion of the conductive trace may include a trace extending in a generally circular pattern adjacent an outer edge of the dielectric plate. The meander pattern of the conductive trace may include a spiral pattern. The conductive trace may be configured to radiate RF energy away from the meandered PCB.

The electronic device may further include an RF trace on the meandered PCB and running along an outer edge of the meandered PCB. The RF trace may have a width of at least about 1 mm. The electronic device may further include a plurality of RF traces on the meandered PCB and running along outer edges of the meandered PCB.

An electronic device according to some embodiments includes an antenna including a dielectric plate oriented parallel to a first direction and a conductive trace on the dielectric plate, and a meandered PCB extending from the antenna on a side of the dielectric plate opposite the conductive trace. The meandered printed circuit board may include a plurality of primary portions extending in a second direction perpendicular to the first direction, and the plurality of primary portions may include electronic circuitry mounted thereon.

The conductive trace may form a meander pattern on the dielectric plate, and the conductive trace may include an RF feed point at a first end of the trace and a ground point at a second end of the trace. The RF feed point may be electrically connected to circuitry mounted on the meandered PCB.

The electronic device may further include a housing, and the dielectric plate may be mounted within the housing and oriented parallel to a first direction. The device may include a planar connection board within the housing and connected to an end of the meandered PCB opposite the dielectric plate, the planar connection board oriented parallel to the first direction, and a speaker connected to the connection board and configured to direct sound away from the housing.

An antenna according to some embodiments includes a dielectric plate oriented parallel to a first direction, and a conductive trace on a surface of the dielectric plate and forming a loop antenna element. The conductive trace may include a high impedance portion proximate the RF feed point and a low impedance portion proximate the ground point, and the high impedance portion of the conductive trace may be located closer to a center of the dielectric plate than the low impedance portion.

The dielectric plate may be generally circular, and the low impedance portion of the conductive trace may include a trace extending in a generally circular pattern adjacent an outer edge of the dielectric plate. The conductive trace may form a spiral loop pattern on the dielectric plate.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

The present invention now will be described more fully with reference to the accompanying drawings, in which embodiments are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

As used herein, the term "comprising" or "comprises" is open-ended, and includes one or more stated features, integers, elements, steps, components or functions but does not preclude the presence or addition of one or more other features, integers, elements, steps, components, functions or groups thereof. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this disclosure and the relevant art and will not be interpreted in an idealized or overly formal sense unless expressly so defined herein.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Furthermore, "coupled" or "connected" as used herein may include wirelessly coupled or connected.

Figure 1:
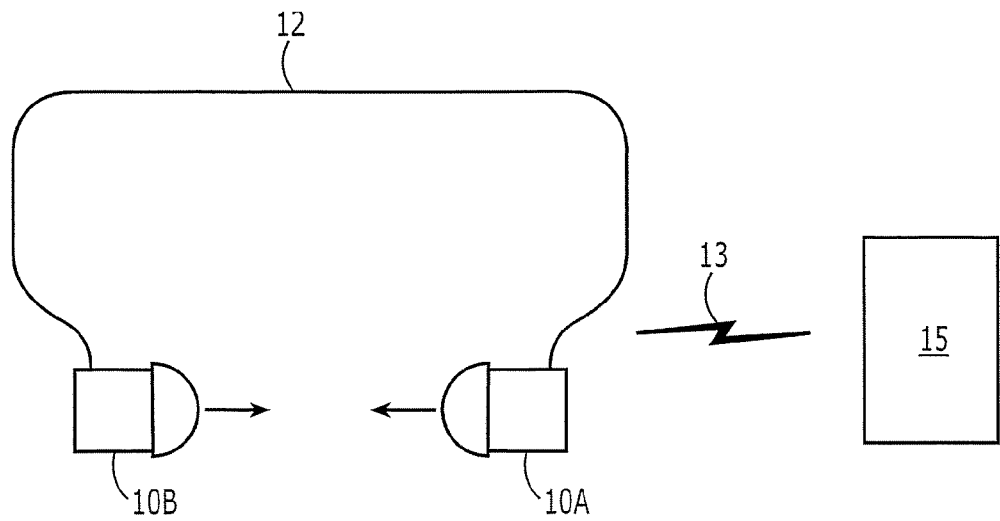
FIG. 1 is a schematic diagram of an earphone assembly according to some embodiments.

Some embodiments will now be described below with respect to FIGS. 1-4. FIG. 1 is a schematic diagram of an earphone assembly according to some embodiments. Referring to FIG. 1, the earphone assembly includes a pair of left and right earphones 10A and 10B connected by an optional cord 12. The earphones 10A, 10B include a short range wireless transceiver, such as a Bluetooth transceiver, that is configured to communicate over a wireless interface 13 with an associated electronic device 15, such as a wireless telephone, personal computer, personal digital assistant (PDA), mp3 player, or the like, that may be carried on or near a user. Using the wireless interface 13, a user can listen to audio signals generated by the electronic device 15, such as when listening to music, listening to a telephone call, etc.

A microphone (not shown) can be located on the cord 12 or otherwise attached to the earphones 10A, 10B to permit the user to transmit voice signals to the electronic device 15. Furthermore, an actuator button (not shown) can be located on the cord 12 and/or the earphones 10A, 10B to permit the user to activate the device 15, to answer a telephone call received by the device 15, etc.

In some embodiments, the earphones 10A, 10B are sized to be insertable within the ear canal of a user. Miniaturizing an antenna to fit within an ear canal presents certain difficulties. For example, small ground planes result in small counterpoise for the antenna. Small antennas typically have a small bandwidth and are difficult to impedance match, giving the entire system an even smaller bandwidth. Some embodiments are directed to antenna structures that can be effectively miniaturized while providing acceptable bandwidth and impedance matching.

Figure 2:
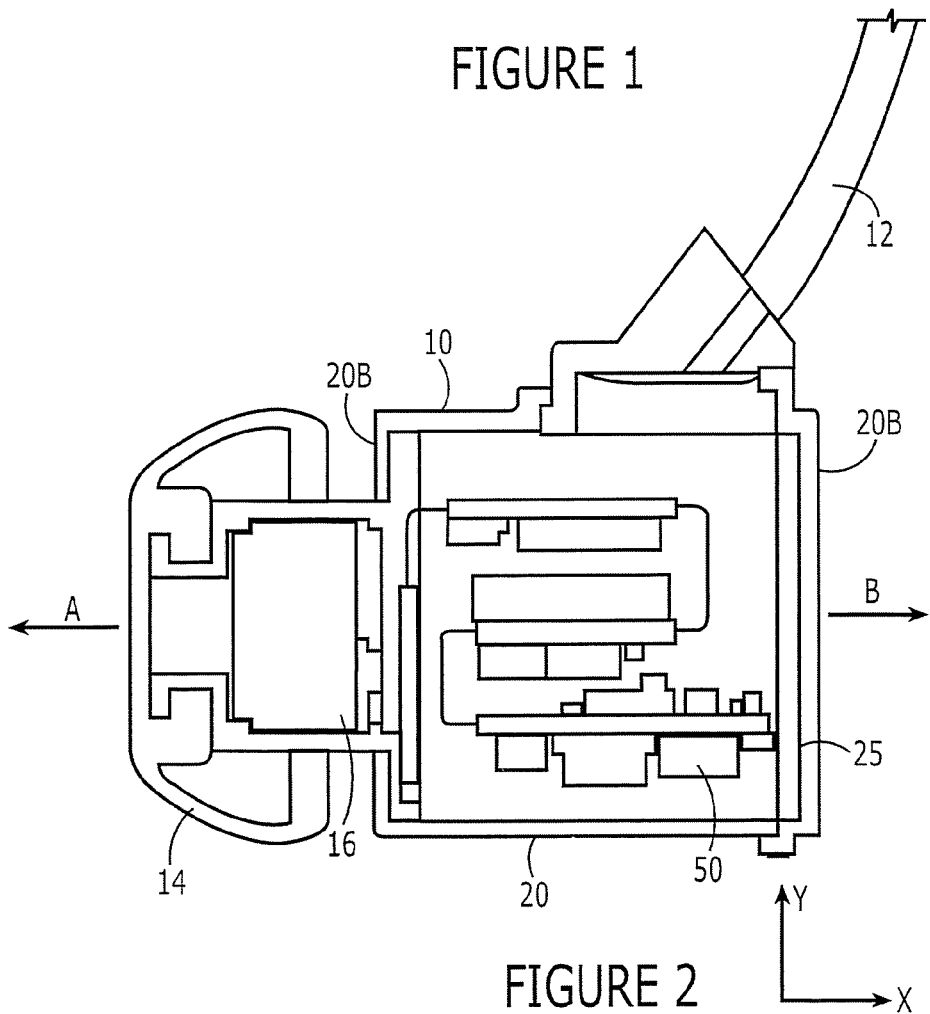
FIG. 2 is a detailed sectional view of an earphone according to some embodiments.

FIG. 2 is a more detailed sectional view of an earphone 10 according to some embodiments. As shown in FIG. 2, the earphone 10 includes a housing 20 that may be generally cylindrical in shape and sized to be insertable into the ear canal of a user. The housing 20 includes a cylindrical body 20A and opposing circular ends 20B. The housing 20 may be constructed of, for example, molded plastic.

A flexible earpiece 14 is mounted at one end of the housing 20 and is configured to comfortably engage a user's ear canal. The earpiece 14 includes an aperture therethrough and is configured to transmit sounds generated by a speaker 16 into the user's ear canal in a direction A. The speaker 16 is mounted on the end 20B of the housing 20 and is electrically connected to circuitry 50 mounted within the housing 20.

Also mounted within the housing 20 and connected to the circuitry 50 is an antenna 25. The antenna 25 may be a directional antenna configured to emit electromagnetic radiation in a direction B away from the housing 20. The antenna 25 may include a dielectric plate 30 (see FIGS. 3 and 4) that is arranged parallel to a first direction, shown in FIGS. 2 and 4 as the Y-direction. The circuitry 50 mounted within the housing 20 may extend away from the antenna in a second direction (the X-direction) that is perpendicular to the first direction. Electromagnetic energy radiated by the antenna 25 may be generally directed away from the housing 20 in the positive-X direction as indicated by the arrow B, while sound emitted by the speaker 16 may be generally directed away from the housing 20 in the negative-X direction, indicated by the arrow A.

An optional cord 12 is connected to the housing 20. In some embodiments, the cord 12 may connect to housing 20 through the cylindrical body 20A so that the cord 12 does not block the end 20B of the housing 20 at which the antenna 25 is located. Accordingly, the cord 12 may interfere less with the operation of the antenna 25 than if the cord 12 entered the housing 20 through the end 20B of the housing 20 at which the antenna 25 is located.

Figure 3:
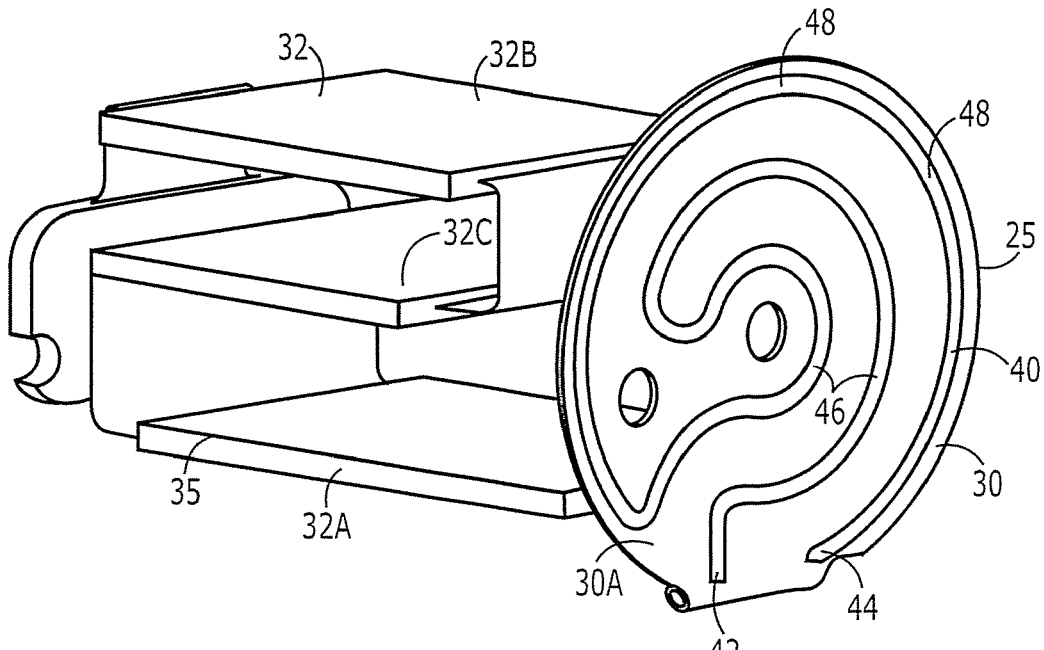
FIG. 3 is a perspective view of an antenna/printed circuit board assembly for use in an earphone according to some embodiments.
Figure 4:
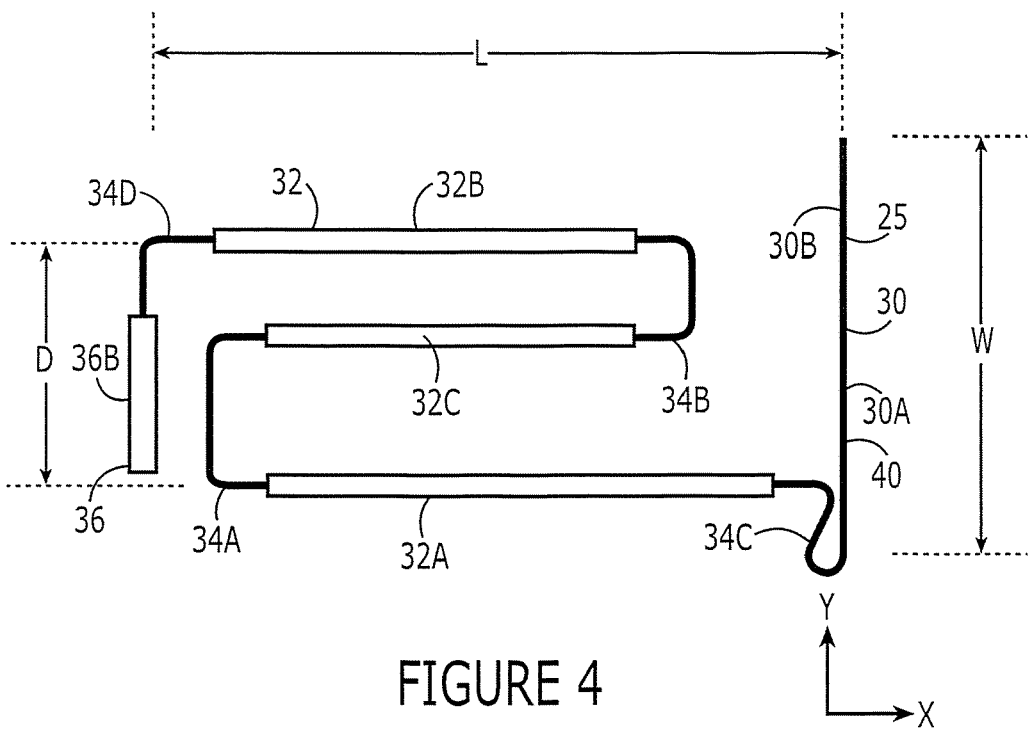
FIG. 4 is a side view of the antenna/printed circuit board assembly of FIG. 3.

FIG. 3 is a perspective view of an antenna/printed circuit board assembly for use in an earphone according to some embodiments, and FIG. 4 is a side view of the antenna/printed circuit board assembly of FIG. 3.

Referring to FIGS. 3 and 4, an electronic device according to some embodiments includes a dielectric plate 30 oriented parallel to a first direction (Y-direction). A conductive trace 40 is formed on a surface 30A of the dielectric plate 30 and forms a meander pattern on the surface 30A of the dielectric plate 30. The conductive trace 40 can be formed by conventional means, such as by blanket depositing a metal layer on the surface 30A of the dielectric plate 30 and selectively etching the metal to form a desired pattern. The dielectric plate may be formed of conventional dielectric materials used in microstrip antennas.

It will be appreciated that no metal ground plane may be provided on the side 30B of the dielectric plate 30 opposite the side 30A on which the conductive trace 40 is formed. Instead of a ground plane, counter-poise is provided by a meandered printed circuit board 32 positioned adjacent the dielectric plate 30, as described more fully below.

The conductive trace 40 forms a spiral loop antenna element including an RF feed point 42 at a first end of the conductive trace 40 and a ground point 44 at a second end of the conductive trace 40. The conductive trace 40 may include a high impedance portion 46 proximate the RF feed point 42 and a low impedance portion 48 proximate the ground point 44. In general, for a microstrip trace antenna, the portion of the microstrip nearest the feed point has a higher impedance than the portion of the microstrip farthest from the feed point. As shown in FIG. 3, the high impedance portion 46 of the conductive trace 40 may be located closer to a center of the dielectric plate 30 than the low impedance portion 48 of the conductive trace 40. It will be appreciated that the spiral does not have to be round, but could have an arbitrary shape.

The dielectric plate 30 may be generally circular, and the low impedance portion 48 of the conductive trace 40 may include a trace extending in a generally circular pattern adjacent an outer edge of the dielectric plate 30 and generally surrounding the high impedance portion 46 of the conductive trace 40. The conductive trace 40 may form a spiral loop pattern on the dielectric plate 30.

By providing the high impedance portion 46 of the conductive trace closer to a center of the dielectric plate 30 than the low impedance portion 48 of the conductive trace 40 so that the low impedance portion 48 of the conductive trace 40 generally surrounds the high impedance portion 46 of the conductive trace 40, the proximity of a large object (e.g. the user's body) near the antenna 25 may have less of a de-tuning effect on the antenna 25.

A meandered printed circuit board (PCB) 32 extends away from the dielectric plate 30 on a side 30B of the dielectric plate 30 opposite the conductive trace 40. An antenna counter-poise is a structure of conductive material that provides a ground structure for an antenna. In a conventional microstrip patch antenna, the ground plane acts as a counter-poise. According to some embodiments, the meandered PCB 32, and electrical traces and the circuitry 50 disposed thereon, can provide a counter-poise for the antenna 25.

The meandered PCB 32 includes a plurality of primary rigid portions 32A-32C extending generally in a second direction (X-direction) that is generally perpendicular to the first direction. The rigid portions 32A-32C include electronic circuitry 50 (FIG. 2) mounted thereon.

The rigid portions 32A-32C of the meandered PCB 32 may include multilayer glass fiber epoxy laminate PCBs on which electronic components may be mounted and on which electronic traces and vias can be formed. The meandered PCB 32 may further include a plurality of flexible PCBs (FPCs) 34A, 34B that interconnect adjacent ones of the rigid PCBs 32A-32C. The FPCs 34A, 34B may not have as many layers as a rigid PCB. For example, a rigid PCB may have six layers, while an FPC may have only two layers. In some embodiments, the FPCs 34A, 34B may be used only to interconnect adjacent rigid portions 32A-32C, and may not be used to mount electronic components. However, in some embodiments, electronic components may be mounted on the FPCs 34A, 34B.

Each of the rigid PCBs 34A-34C may include a solid ground plane therein that may assist the PCB 32 in providing a counter-poise for the antenna 25.

The rigid portions 32A-32C may be spaced apart from one another in the first direction and may overlap one another in the second direction. In particular, the meandered PCB 32 may include a first rigid PCB 32A and a second rigid PCB 32B that are arranged generally parallel to one another, that are non-coplanar, that are spaced apart from one another in the first (Y) direction, and that overlap in the second (X) direction. A third rigid PCB 32C is between and generally parallel to the first and second rigid PCBs 32A, 32B. It will be appreciated that the meandered PCB 32 could include more or less than three rigid PCBs.

A distance D between the outermost rigid PCBs 32A, 32B may be less than a width W of the dielectric plate 30. A total electrical length of the meandered PCB 32 including the rigid portions 32A-32C and the FPCs 34A, 34B may be about one quarter of a center wavelength of the antenna 25. However, due to the meandered topology of the meandered PCB 32, the meandered PCB extends only a distance L in the second direction that is less than the total physical length of the rigid portions 32A-32C and flexible portions 34A, 34B of the meandered PCB 32. Thus, the housing 20 in which the antenna 25 and meandered PCB 32 are mounted can be small enough to fit into a user's ear canal.

The conductive trace 40 on the dielectric plate 30 may be connected to a first end of the meandered PCB 32, for example, by an FPC 34C. The conductive trace 40 may be configured to radiate RF energy away from the meandered PCB 32.

A planar connection board 36 is connected to a second end of the meandered PCB 32, opposite the first end of the meandered PCB 32 at which the dielectric plate is attached, through an FPC 34D. The planar connection board 36 may have a major surface 36A oriented parallel to the first direction (i.e., parallel to the dielectric plate 30). The speaker 16

(FIG. 2) may be attached to the planar connection board 36 and may thereby connect to the circuitry 50 on the meandered PCB 32.

The meandered PCB 32 may further include one or more relatively wide RF traces 35 running along outer edges of the meandered PCB 32. The RF traces 35 may have a width of at least about 1 mm, and may be configured to effectively conduct RF energy. In some embodiments, a plurality of RF traces 35 may be provided on the meandered PCB 32 and running along outer edges of the meandered PCB 32. The RF traces 35 may have an electrical length that is equal to about one quarter of the center wavelength of the device.

As described above, some embodiments provide a dielectric loaded spiral loop antenna having a compact size and shape. An antenna as described above can operate with high efficiency with a small counter-poise. A spiral loop antenna with a dielectric load according to some embodiments can be designed to have an impedance near 50 Ohms. Therefore, fewer matching components may be required, resulting in lower loss and/or lower PCB space requirements.

An antenna including a spiral pattern as described herein can have a small shape while providing a reasonable bandwidth. By providing a meandered PCB as a counter-poise behind the antenna, the counter-poise will both act as a shield and maintain a physical distance between the loop antenna and an object in which the antenna is inserted, so that the antenna can have reasonably good efficiency even when operated in proximity to the human body, such as within a user's ear canal.

In the drawings and specification, there have been disclosed typical embodiments and, although specific terms are employed, they are used in a generic and descriptive sense only and not for purposes of limitation, the scope of the invention being set forth in the following claims.

That which is claimed is:

1. An electronic device, comprising:
a dielectric plate oriented parallel to a first direction;
a conductive trace on a surface of the dielectric plate and forming a meander pattern on the surface of the dielectric plate, the conductive trace forming a loop antenna element including an RF feed point at a first end of the trace and a ground point at a second end of the conductive trace; and
a meandered printed circuit board (PCB) extending from the dielectric plate on a side of the dielectric plate opposite the conductive trace, the meandered PCB including a plurality of primary portions extending in a second direction perpendicular to the first direction, the plurality of primary portions including electronic components mounted thereon.

2. The electronic device of claim 1, wherein the primary portions of the meandered PCB comprise rigid PCBs.

3. The electronic device of claim 2, wherein the meandered PCB includes a plurality of flexible PCBs, the plurality of flexible PCBs connecting adjacent ones of the plurality of rigid PCBs.

4. The electronic device of claim 2, further comprising first and second parallel rigid PCBs and a third rigid PCB between the first and second rigid PCBs, wherein a distance between the first and second rigid PCBs is less than a width of the conductive plate.

5. The electronic device of claim 1, wherein a total length of the meandered printed circuit board is about one quarter of a center wavelength of the antenna.

6. The electronic device of claim 1, wherein the primary portions are spaced apart from one another in the first direction.

7. The electronic device of claim 1, wherein the meander pattern comprises a spiral pattern.

8. The electronic device of claim 1, wherein the conductive trace is configured to radiate RF energy away from the meandered PCB.

9. The electronic device of claim 1, wherein the dielectric plate is connected to a first end of the meandered PCB, the device further comprising a planar connection board connected to a second end of the meandered PCB, opposite the first end of the meandered PCB, the planar connection board having a major surface oriented parallel to the first direction.

10. The electronic device of claim 1, wherein the conductive trace includes a high impedance portion proximate the RF feed point and a low impedance portion proximate the ground point, wherein the high impedance portion of the conductive trace is located closer to a center of the dielectric plate than the low impedance portion.

11. The electronic device of claim 10, wherein the dielectric plate is generally circular, and wherein the low impedance portion of the conductive trace comprises a trace extending in a generally circular pattern adjacent an outer edge of the dielectric plate.

12. The electronic device of claim 1, further comprising an RF trace on the meandered PCB and running along an outer edge of the meandered PCB.

13. The electronic device of claim 12, wherein the RF trace has a width of at least about 1 mm.

14. The electronic device of claim 12, further comprising a plurality of RF traces on the meandered PCB and running along outer edges of the meandered PCB.

15. An electronic device, comprising:
an antenna including a dielectric plate oriented parallel to a first direction and a conductive trace on the dielectric plate; and
a meandered printed circuit board (PCB) extending from the antenna on a side of the dielectric plate opposite the conductive trace, the meandered printed circuit board including a plurality of primary portions extending in a second direction perpendicular to the first direction, the plurality of primary portions including electronic circuitry mounted thereon.

16. The electronic device of claim 15, wherein the conductive trace forms a meander pattern on the dielectric plate, the conductive trace including an RF feed point at a first end of the trace and a ground point at a second end of the trace, and wherein the RF feed point is electrically connected to circuitry mounted on the meandered PCB.

17. The electronic device of claim 15, further comprising:
a housing, wherein the dielectric plate is mounted within the housing and oriented parallel to a first direction;
a planar connection board within the housing and connected to an end of the meandered PCB opposite the dielectric plate, the planar connection board oriented parallel to the first direction; and
a speaker connected to the connection board and configured to direct sound away from the housing.

18. An antenna, comprising:
a dielectric plate oriented parallel to a first direction; and
a conductive trace on a surface of the dielectric plate, wherein the conductive trace forms a spiral loop pattern on the dielectric plate, the conductive trace forming a loop antenna element and including an RF feed point and a ground point, wherein each of the RF feed point and the ground point is positioned adjacent an outer edge of the dielectric plate;

wherein the conductive trace includes a high impedance portion proximate the RF feed point and a low impedance portion proximate the ground point; and wherein the high impedance portion of the conductive trace is located closer to a center of the dielectric plate than the low impedance portion.

19. The antenna of claim 18, wherein the dielectric plate is generally circular, and wherein the low impedance portion of the conductive trace comprises a trace extending in a generally circular pattern adjacent an outer edge of the dielectric plate.

* * * * *